(12) United States Patent
Sasaki

(10) Patent No.: US 7,102,275 B2
(45) Date of Patent: Sep. 5, 2006

(54) STACK-TYPE PIEZOELECTRIC DEVICE

(75) Inventor: Satoshi Sasaki, Yuri-gun (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/984,758

(22) Filed: Nov. 10, 2004

(65) Prior Publication Data
US 2005/0104482 A1    May 19, 2005

(30) Foreign Application Priority Data
Nov. 11, 2003    (JP) .............................. 2003-381645

(51) Int. Cl.
*H01L 41/047* (2006.01)
*H01L 41/083* (2006.01)
(52) U.S. Cl. ...................... 310/366; 310/365
(58) Field of Classification Search ................ 310/366, 310/365
See application file for complete search history.

(56) References Cited

U.S. PATENT DOCUMENTS

2006/0061241 A1 *  3/2006  Sasaki ........................ 310/366

FOREIGN PATENT DOCUMENTS

| JP | A-2001-076952 | | 3/2001 |
| JP | A-2001-260349 | | 9/2001 |
| JP | A-2002-019102 | | 1/2002 |
| JP | A-2002-254634 | * | 9/2002 |

* cited by examiner

*Primary Examiner*—Thomas M. Dougherty
(74) *Attorney, Agent, or Firm*—Oliff & Berridge, PLC

(57) ABSTRACT

Provided is a stack-type piezoelectric device capable of preventing variations in a response time of an active part corresponding to each individual electrode from occurring depending upon locations of individual electrodes.

In a stack-type piezoelectric device 1, a voltage is almost simultaneously applied through electroconductive members in a plurality of through holes formed in each of piezoelectric layers 3, 5 and along an extending direction of relay electrodes 6, to portions opposed to individual electrodes 2 arrayed in each row direction, in each of common electrodes 4, 4 adjacent in the thickness direction. Therefore, it is feasible to prevent the variations in the response time of the active part corresponding to each individual electrode 2 from occurring depending upon the locations of the individual electrodes 2 arranged in a matrix, whereby the stack-type piezoelectric device 1 can be appropriately driven.

1 Claim, 6 Drawing Sheets

STACK-TYPE PIEZOELECTRIC DEVICE

BACKGROUND OF THE INVENTION

1. Field of the Invention

The present invention relates to a stack-type piezoelectric device used as a drive source for small displacement, such as control of a valve of a micropump.

2. Related Background Art

An example of the conventional stack-type piezoelectric devices is the one described in Japanese Patent Application Laid-Open No. 2002-254634. This stack-type piezoelectric device consists of an alternate stack of piezoelectric layers in each of which a number of individual electrodes are formed in a pattern, and piezoelectric layers in each of which a common electrode is formed in a pattern, and the individual electrodes aligned in the thickness direction of the stack-type piezoelectric device are connected by electroconductive members through through holes formed in the piezoelectric layers. In this stack-type piezoelectric device, when a voltage is applied between predetermined individual electrodes and common electrodes, active parts (portions to be distorted by piezoelectric effect) corresponding to the predetermined individual electrodes in the piezoelectric layers are selectively displaced.

SUMMARY OF THE INVENTION

However, the above-stated stack-type piezoelectric device has the following problem. Namely, the common electrodes adjacent to each other in the thickness direction of the stack-type piezoelectric device are electrically connected by the electroconductive members in the through holes through the intervention of relay electrodes formed in a pattern in both edge regions of the piezoelectric layers provided with the individual electrodes. For this reason, in a case where the voltage is applied between the individual electrodes formed far from the both edge regions of the piezoelectric layers, and the common electrodes, a time necessary for displacement of the active parts corresponding to the individual electrodes after application of the voltage (hereinafter referred to as a "response time of the active part") is longer than that in a case where the voltage is applied between the individual electrodes formed near the both edge regions of the piezoelectric layers, and the common electrodes. There thus occur variations in the response time of the active part corresponding to each individual electrode, depending upon the locations of the individual electrodes, which can impede appropriate drive of the stack-type piezoelectric device.

The present invention has been accomplished in view of such circumstances, and an object of the present invention is to provide a stack-type piezoelectric device capable of preventing the variations in the response time of the active part corresponding to each individual electrode from occurring depending upon the locations of the individual electrodes.

In order to achieve the above object, a stack-type piezoelectric device according to the present invention is a stack-type piezoelectric device comprising an alternate stack of first piezoelectric layers and second piezoelectric layers, wherein a plurality of individual electrodes electrically independent of each other are formed in each of the first piezoelectric layers, wherein a common electrode adapted for application of a voltage between the common electrode and the individual electrodes is formed in each of the second piezoelectric layers, wherein a relay electrode extending along ends of the individual electrodes arrayed in a predetermined direction is formed in each of the first piezoelectric layers, and wherein the common electrodes adjacent in a thickness direction of the first and second piezoelectric layers are electrically connected through the relay electrode by electroconductive members in a plurality of through holes formed in the first piezoelectric layers and along the extending direction of the relay electrode and by electroconductive members in a plurality of through holes formed in the second piezoelectric layers and along the extending direction of the relay electrode.

In this stack-type piezoelectric device, a voltage is almost simultaneously applied through the electroconductive members in the plurality of through holes formed in each piezoelectric layer and along the extending direction of the relay electrode, to portions opposed to the individual electrodes arrayed in the predetermined direction, in each of the common electrodes adjacent in the thickness direction of the first and second piezoelectric layers. Therefore, it is feasible to prevent the variations in the response time of the active part corresponding to each individual electrode from occurring depending upon the locations of the individual electrodes. Furthermore, since the stack-type piezoelectric device has the configuration wherein the relay electrode is formed so as to extend and wherein the relay electrode and common electrodes are electrically connected by the electroconductive members in the plurality of through holes, the electric resistance on the common electrode side can be lowered upon application of the voltage between the individual electrodes and the common electrodes.

DESCRIPTION OF THE PREFERRED EMBODIMENT

A preferred embodiment of the stack-type piezoelectric device according to the present invention will be described below in detail with reference to the drawings.

Figure 1:
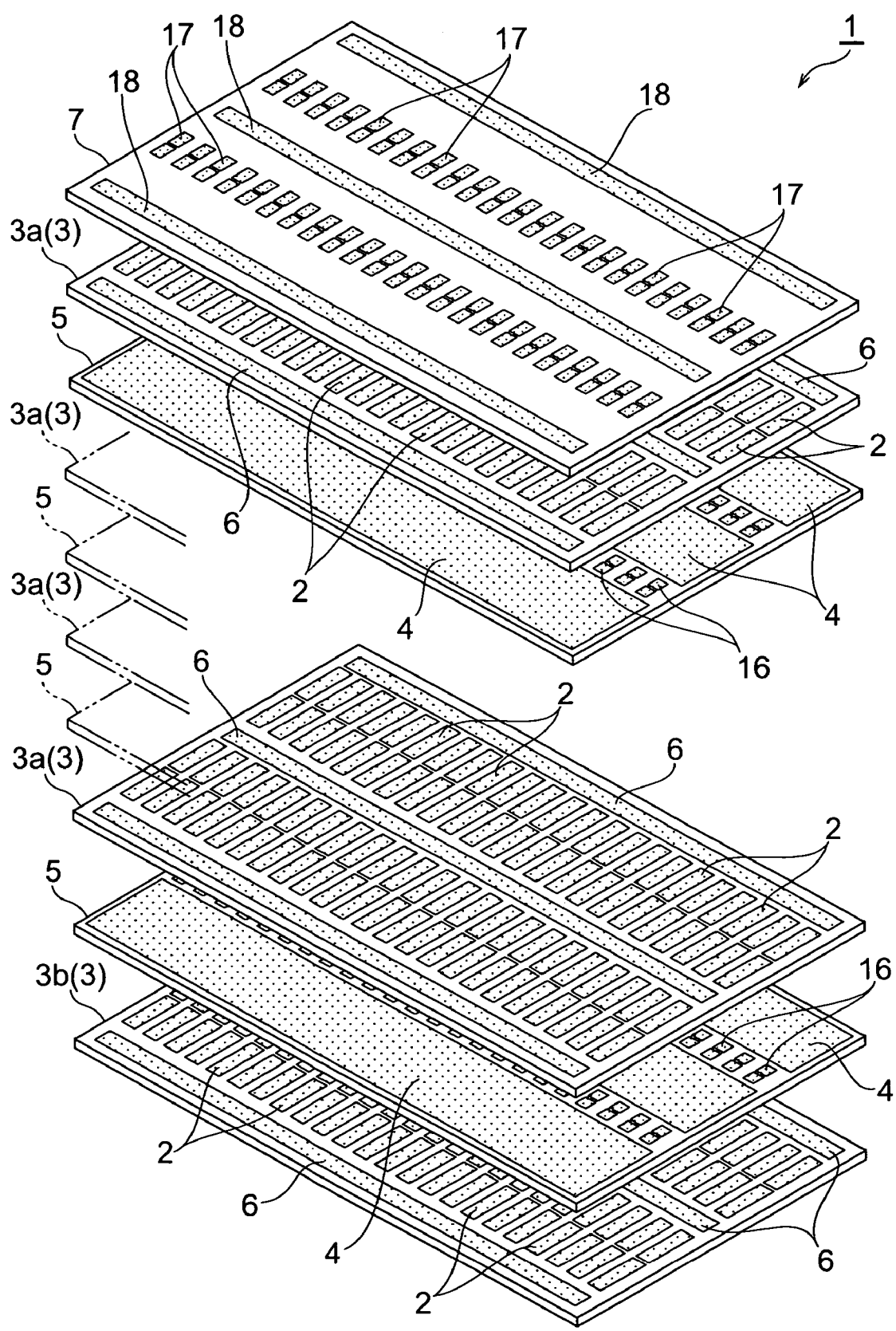
FIG. 1 is an exploded perspective view showing an embodiment of the stack-type piezoelectric device according to the present invention.

FIG. 1 is an exploded perspective view showing an embodiment of the stack-type piezoelectric device according to the present invention. As shown in the same figure, the stack-type piezoelectric device 1 is comprised of an alternate stack of piezoelectric layers (first piezoelectric layers) 3 in each of which individual electrodes 2 are formed, and piezoelectric layers (second piezoelectric layers) 5 in each of which common electrodes 4 are formed, and a piezoelectric layer 7 with terminal electrodes 17, 18 as an uppermost layer.

Each piezoelectric layer 3, 5, 7 consists primarily of a ceramic material such as lead zirconate titanate and is formed, for example, in a rectangular thin plate shape of "10 mm×30 mm and 30 μm thick." The individual electrodes 2 and common electrodes 4 are made of a material consisting primarily of silver and palladium, and are formed in a pattern by screen printing. This also applies similarly to each of electrodes described below, except for the terminal electrodes 17, 18.

Figure 2:
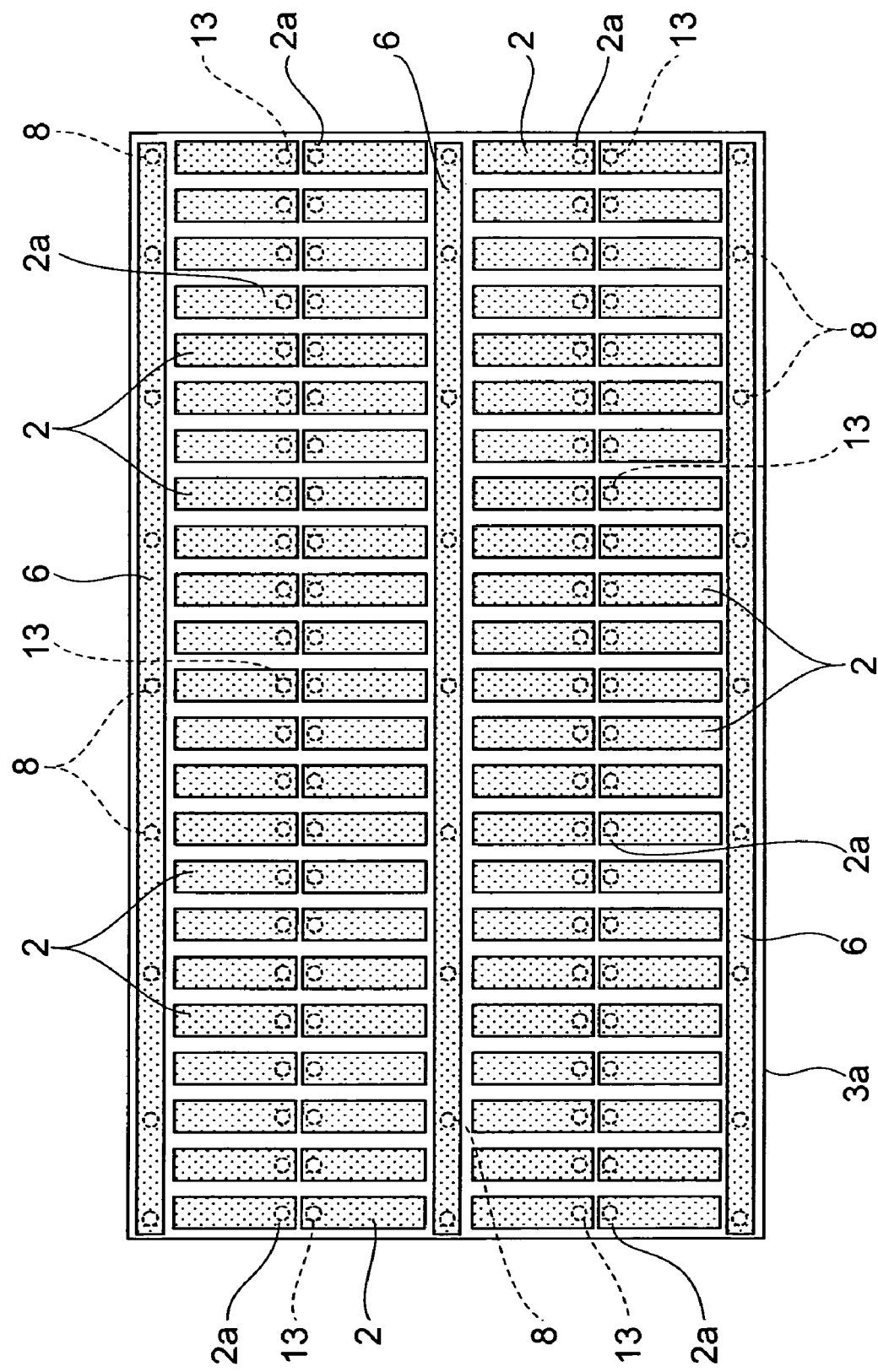
FIG. 2 is a plan view of the second, fourth, sixth, and eighth piezoelectric layers in the stack-type piezoelectric device shown in FIG. 1.

In this stack-type piezoelectric device 1, a number of rectangular individual electrodes 2 are arranged in a matrix, as shown in FIG. 2, on the upper surfaces of the second, fourth, sixth, and eighth piezoelectric layers 3a as counted from the uppermost piezoelectric layer 7. Each individual electrode 2 is placed so that the longitudinal direction thereof is perpendicular to the longitudinal direction of the piezoelectric layer 3a, and adjacent individual electrodes 2, 2 are placed with a predetermined space to achieve electrical independence of each other and to prevent interference between each other's vibrations.

Let the longitudinal direction of the piezoelectric layers 3a be a row direction and the direction perpendicular to the longitudinal direction be a column direction. Then the individual electrodes 2 are arranged, for example, in a matrix of four rows and seventy five columns (the drawing shows a matrix of four rows and twenty three columns for clarity). This matrix arrangement of many individual electrodes 2 enables efficient arrangement for the piezoelectric layers 3a, and it is thus feasible to achieve miniaturization of the stack-type piezoelectric device 1 or high integration of individual electrodes 2, while maintaining the area of active parts contributing to vibration in the piezoelectric layers 3a.

The individual electrodes 2 in the first row and in the second row have their respective ends opposed between the first row and the second row, as connection ends 2a, and are connected to electroconductive members in through holes 13 formed immediately below the connection ends 2a in the piezoelectric layer 3a. Similarly, the individual electrodes 2 in the third row and in the fourth row have their respective ends opposed between the third row and the fourth row, as connection ends 2a, and are connected to electroconductive members in through holes 13 formed immediately below the connection ends 2a in the piezoelectric layer 3a.

A relay electrode 6 of rectangular shape extending along the ends of individual electrodes 2 arrayed in the first row is formed outside the individual electrodes 2 in the first row on the upper surface of each piezoelectric layer 3a and, similarly, a relay electrode 6 of rectangular shape extending along he ends of individual electrodes 2 arrayed in the fourth row is formed outside the individual electrodes 2 in the fourth row on the upper surface of the piezoelectric layer 3a. Furthermore, a relay electrode 6 of rectangular shape extending along the ends of individual electrodes 2 arrayed in the second row and in the third row is formed between the individual electrodes 2 in the second row and the individual electrodes 2 in the third row on the upper surface of the piezoelectric layer 3a.

Each relay electrode 6 is connected to electroconductive members in a plurality of through holes 8 formed immediately below the relay electrode 6 in the piezoelectric layer 3a. The plurality of through holes 8 formed immediately below each relay electrode 6 in the piezoelectric layer 3a are formed at predetermined intervals along the extending direction of the relay electrode 6, for example, one per two or three individual electrodes 2.

Figure 3:
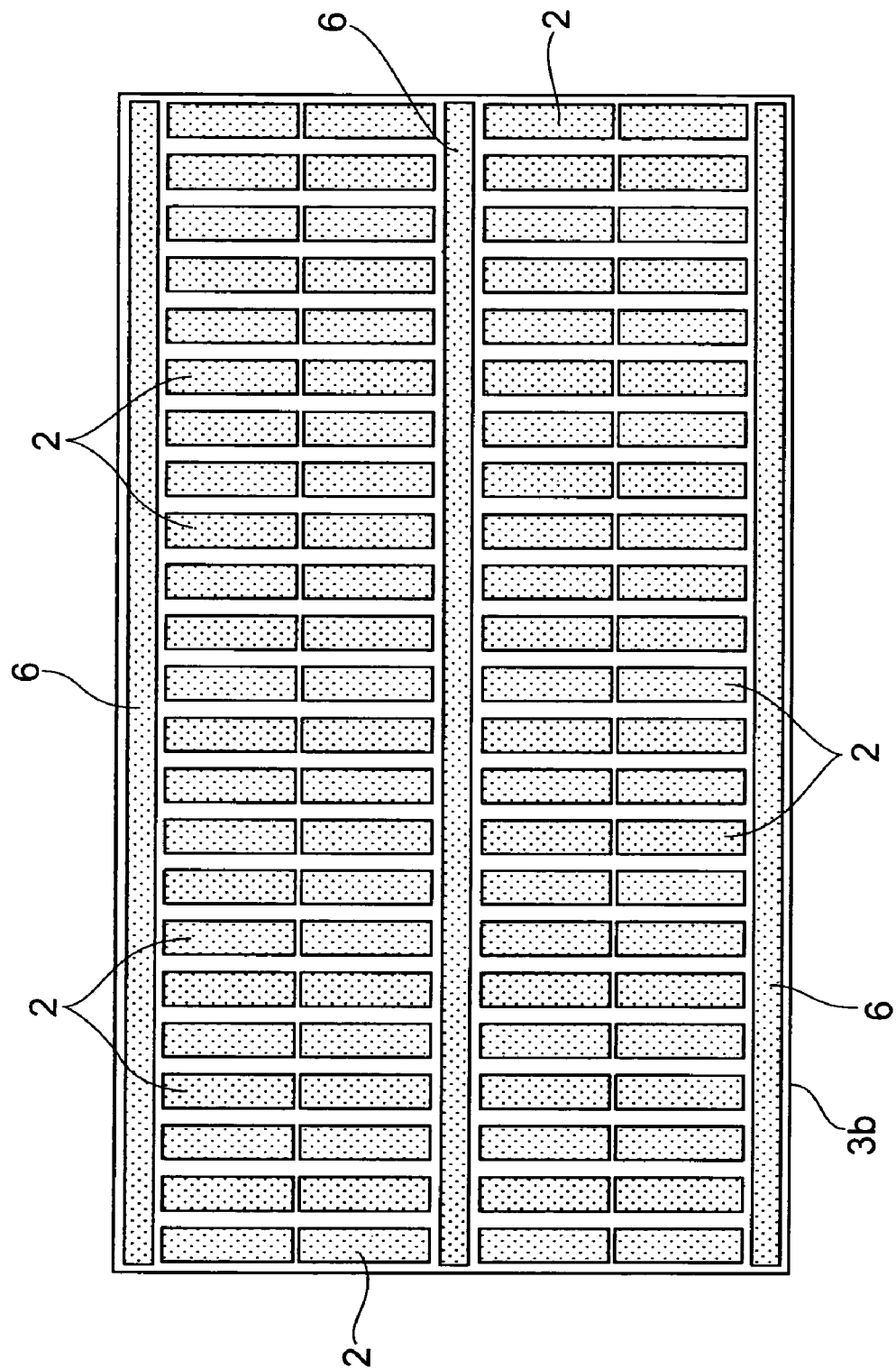
FIG. 3 is a plan view of the tenth piezoelectric layer in the stack-type piezoelectric device shown in FIG. 1.

Just as in the second, fourth, sixth, and eighth piezoelectric layers 3a described above, the individual electrodes 2 and relay electrodes 6 are also formed on the upper surface of the piezoelectric layer 3b located as the tenth layer. The tenth piezoelectric layer 3b, however, is different from the aforementioned piezoelectric layers 3a in that the through holes 8, 13 are not formed, as shown in FIG. 3.

Figure 4:
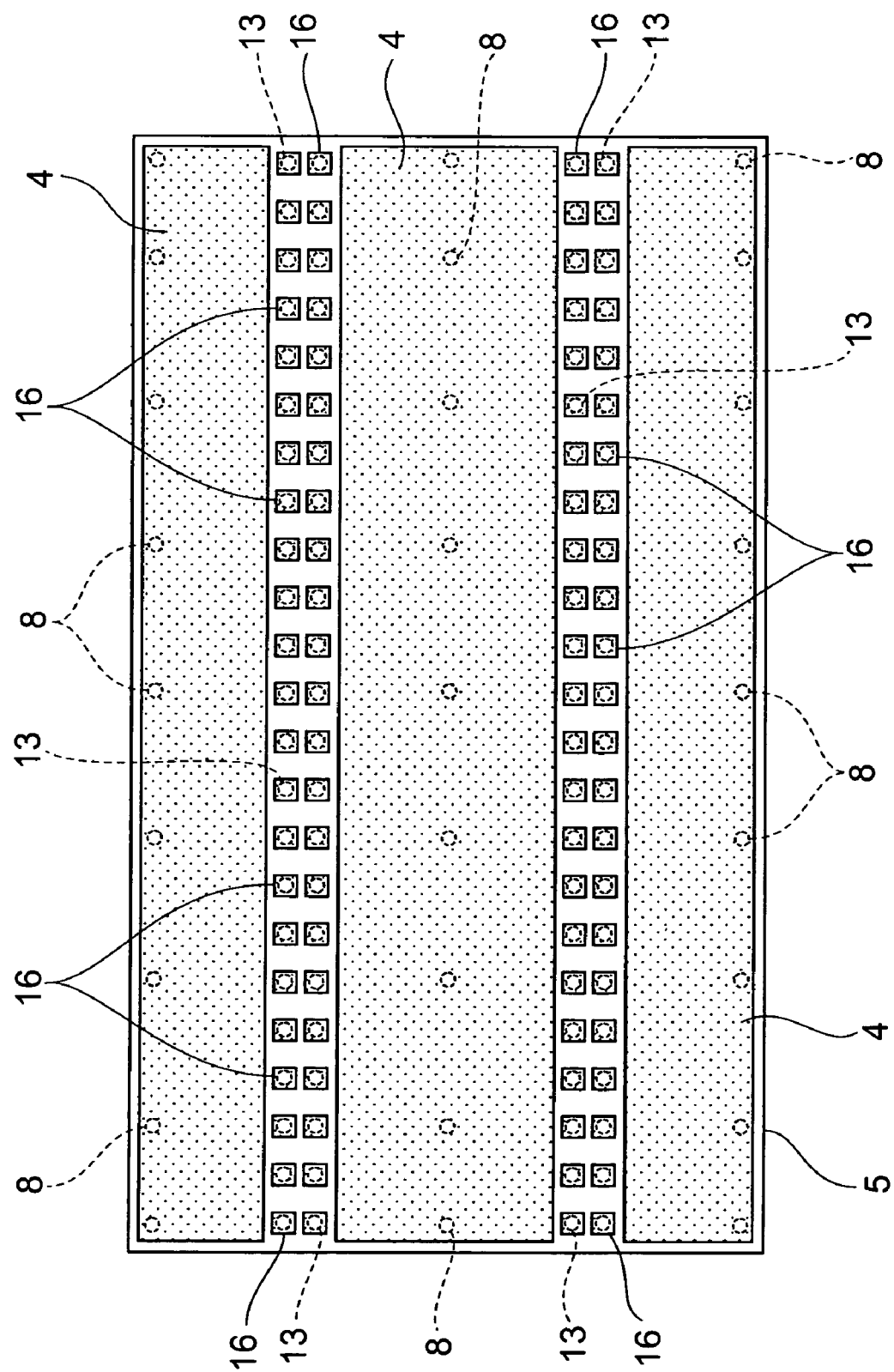
FIG. 4 is a plan view of the third, fifth, seventh, and ninth piezoelectric layers in the stack-type piezoelectric device shown in FIG. 1.

As shown in FIG. 4, relay electrodes 16 are formed so as to face the respective connection ends 2a of the piezoelectric layers 3a in the thickness direction of the stack-type piezoelectric device 1, on the upper surfaces of the third, fifth, seventh, and ninth piezoelectric layers 5 as counted from the uppermost piezoelectric layer 7 (the "thickness direction of stack-type piezoelectric device 1," i.e., "thickness direction of piezoelectric layers 3, 5" will be referred to hereinafter simply as "thickness direction"). Each relay electrode 16 is connected to an electroconductive member in a through hole 13 formed immediately below the relay electrode in the piezoelectric layer 5.

Furthermore, common electrodes 4 are formed on the upper surface of each piezoelectric layer 5. The common electrodes 4 are formed in rectangular shape, one outside the relay electrodes 16 in the first row, another between the relay electrodes 16 in the second row and the relay electrodes 16 in the third row, and the other outside the relay electrodes 16 in the fourth row, and overlap the portions of the individual electrodes 2 except for the connection ends 2a thereof, when viewed from the thickness direction. This allows the whole of the portions facing the portions of the individual electrodes 2 except for the connection ends 2a thereof in the piezoelectric layers 3, 5 to be effectively used as active parts contributing to vibration. Each common electrode 4 is connected to electroconductive members in a plurality of through holes 8 formed in the piezoelectric layer 5 and along the extending direction of the relay electrodes 6, so as to face the relay electrode 6 of the piezoelectric layer 3 in the thickness direction.

Figure 5:
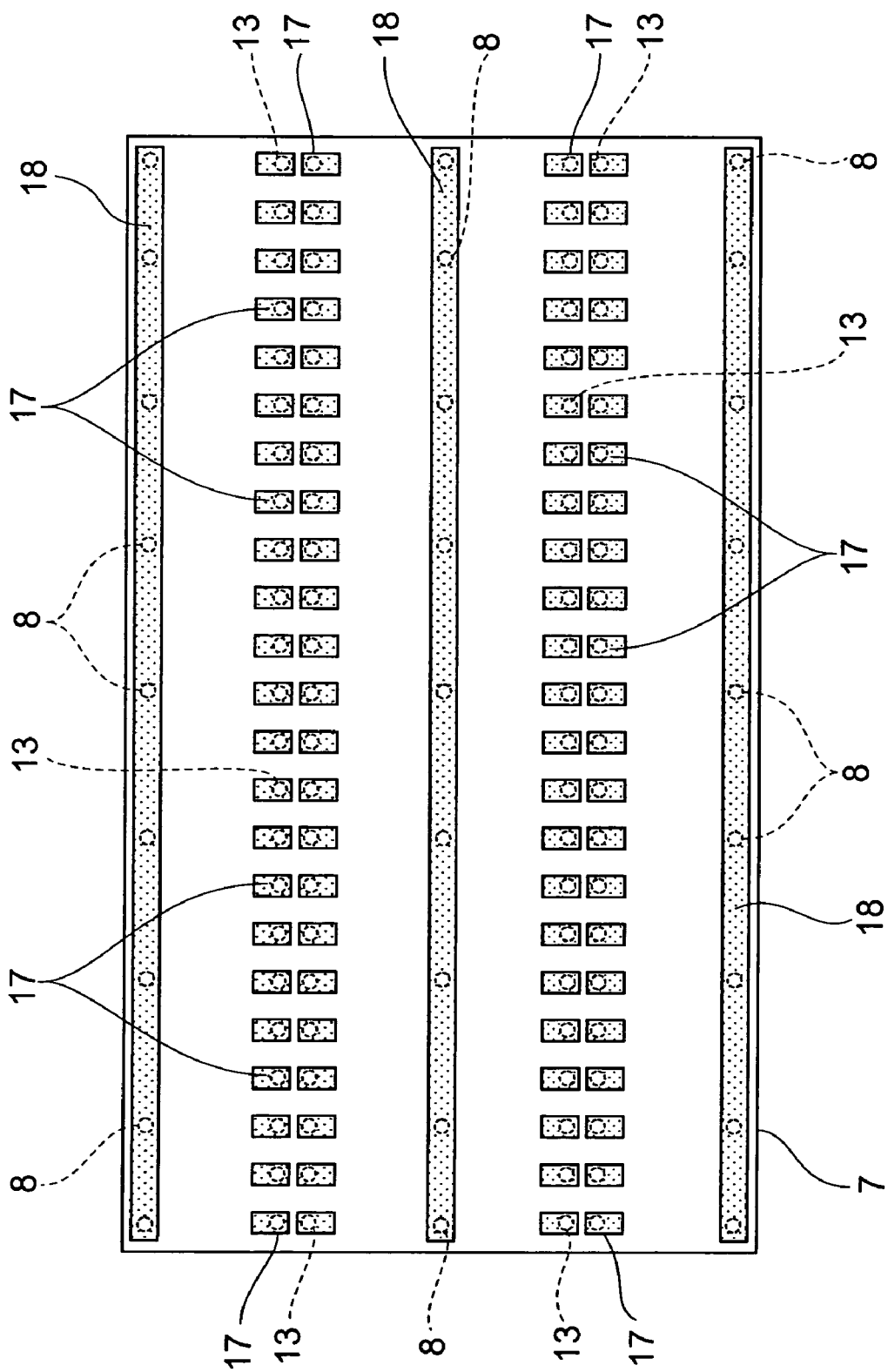
FIG. 5 is a plan view of the uppermost piezoelectric layer in the stack-type piezoelectric device shown in FIG. 1.

On the upper surface of the uppermost piezoelectric layer 7, as shown in FIG. 5, terminal electrodes 17 are formed so as to face the respective relay electrodes 16 of the piezoelectric layer 5 in the thickness direction, and terminal electrodes 18 are formed to extend so as to face the relay electrodes 6 of the piezoelectric layer 3 in the thickness direction. Each terminal electrode 17 is connected to an electroconductive member in a through hole 13 formed immediately below the terminal electrode in the piezoelectric layer 7. On the other hand, each terminal electrode 18 is connected to electroconductive members in a plurality of through holes 8 formed in the piezoelectric layer 7 and along the extending direction of the relay electrode 6, so as to face the relay electrode 6 of the piezoelectric layer 3 in the thickness direction. Lead wires for connection to a drive power supply are soldered to these terminal electrodes 17, 18.

Figure 6:
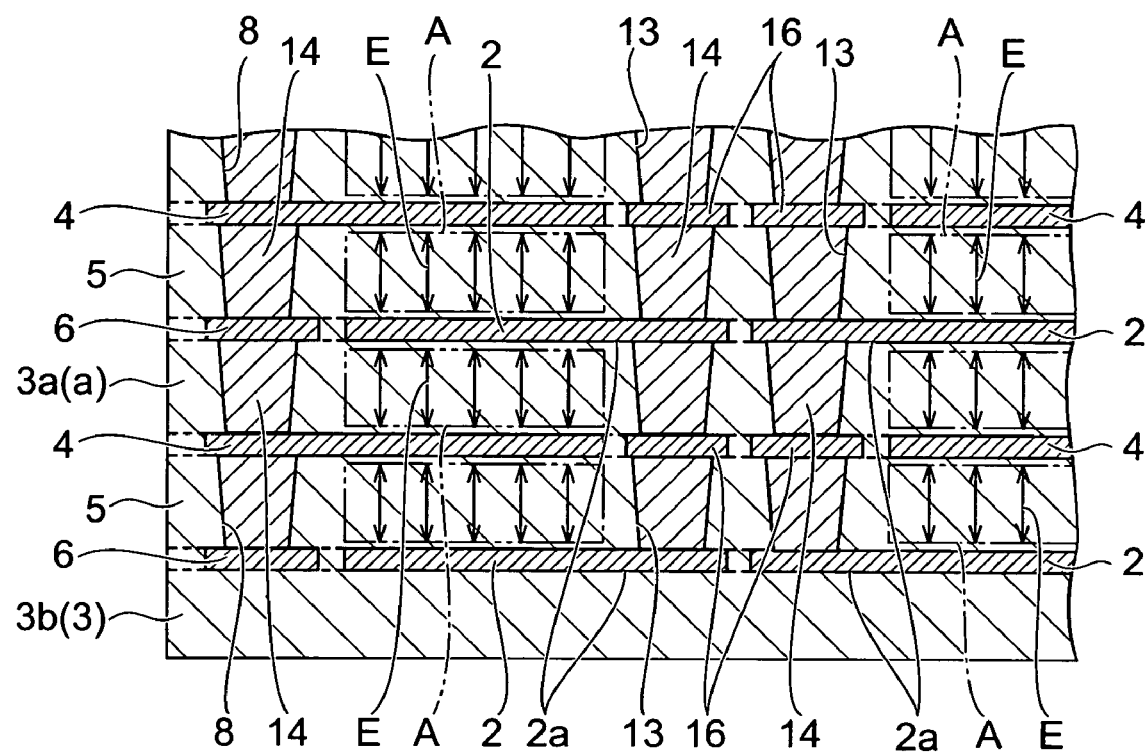
FIG. 6 is an enlarged sectional view in the direction perpendicular to the longitudinal direction of the stack-type piezoelectric device shown in FIG. 1.

By the stack of piezoelectric layers 3, 5, 7 with the electrode patterns formed as described above, five individual electrodes 2 are aligned through the intervention of the relay electrodes 16 in the thickness direction, for each terminal electrode 17 of the uppermost layer, and the electrodes 2, 16, and 17 thus aligned are electrically connected by the electroconductive members 14 in the through holes 13, as shown in FIG. 6. On the other hand, for each terminal electrode 18 of the uppermost layer, four common electrodes 4 are aligned through the intervention of the relay electrodes 6 in the thickness direction, and the electrodes 4, 6, 18 thus aligned are electrically connected by the electroconductive members 14 in the through holes 8.

In this electrical connection in the stack-type piezoelectric device 1, when a voltage is applied between predetermined terminal electrode 17 and terminal electrode 18, the voltage is applied between the individual electrodes 2 aligned under the predetermined terminal electrode 17, and the common electrodes 4. This results in establishing electric fields E in the portions between the individual electrodes 2 and the common electrodes 4, as shown in FIG. 6, in the piezoelectric layers 3, 5, whereby these portions are displaced as active parts A. By selecting a terminal electrode 17 to which a voltage is to be applied, therefore, it is feasible to displace active parts A aligned under the selected terminal electrode 17, in the thickness direction, among the active parts A corresponding to the respective individual electrodes 2 arranged in the matrix. The stack-type piezoelectric device 1 is applied to the drive source of various devices involving small displacement, such as control of a valve of a micropump.

In the stack-type piezoelectric device 1 constructed as described above, the voltage is almost simultaneously applied through the electroconductive members 14 in the plurality of through holes 8 formed in each piezoelectric layer 3, 5 and along the extending direction of the relay electrodes 6, to the portions facing the individual electrodes 2 arrayed in each row direction, in each of common electrodes 4, 4 adjacent in the thickness direction. Therefore, it is feasible to prevent the variations in the response time of the active part A corresponding to each individual electrode 2 from occurring depending upon the locations of the individual electrodes 2 arranged in the matrix, whereby the stack-type piezoelectric device 1 can be appropriately driven.

Furthermore, in the stack-type piezoelectric device 1 the relay electrodes 6 for electrical connection between adjacent common electrodes 4, 4 in the thickness direction are formed so as to extend, and the relay electrodes 6 and common electrodes 4 are electrically connected by the electroconductive members 14 in the plurality of through holes 8. For this reason, the electric resistance can be lowered on the common electrode 4 side upon application of the voltage between the individual electrodes 2 and common electrodes 4. Therefore, it is feasible to reduce a load on a drive circuit of the stack-type piezoelectric device 1 and to suppress generation of heat in an entire product including the stack-type piezoelectric device 1 and the drive circuit.

Next, a production procedure of the stack-type piezoelectric device 1 will be described. First, a substrate paste is prepared by mixing an organic binder, an organic solvent, etc. into a piezoelectric ceramic material consisting primarily of lead zirconate titanate or the like, and this substrate paste is used to form green sheets for the respective piezoelectric layers 3, 5, 7. An electroconductive paste is also prepared by mixing an organic binder, an organic solvent, etc. into a metal material consisting of silver and palladium in a predetermined proportion.

Subsequently, laser light is applied to predetermined positions of the green sheets for the respective piezoelectric layers 3, 5, 7 to form the through holes 8, 13. Then filling screen print with the electroconductive paste is carried out into the through holes 8, 13 to form the electroconductive members 14. Thereafter, screen print with the electroconductive paste is carried out onto the green sheets for the respective piezoelectric layers 3, 5 to form the electrodes 2, 4, 6, 16. Screen print with the electroconductive paste is also carried out onto the green sheet for the uppermost piezoelectric layer 7 to form ground electrodes of the terminal electrodes 17, 18.

Subsequently, the green sheets with the electrode patterns thereon are stacked in the aforementioned order and are pressed in the stack direction to form a green laminate. This green laminate is degreased and baked, and thereafter baked electrodes of silver are placed on the respective ground electrodes on the calcined sheet for the piezoelectric layer 7 to form the terminal electrodes 17, 18. Thereafter, a polarization process is carried out to complete the stack-type piezoelectric device 1. The baking of silver in the formation of the terminal electrodes 17, 18 may be replaced by baking using gold, copper, or the like as a material, sputtering, vapor deposition, or electroless plating as a forming method, or the like.

The present invention prevents the variations in the response time of the active part corresponding to each individual electrode from occurring depending upon the locations of the individual electrodes.

What is claimed is:

1. A stack-type piezoelectric device comprising an alternate stack of first piezoelectric layers and second piezoelectric layers, wherein a plurality of individual electrodes electrically independent of each other are formed in each of the first piezoelectric layers, wherein a common electrode adapted for application of a voltage between the common electrode and the individual electrodes is formed in each of the second piezoelectric layers, wherein a relay electrode is formed in each of the first piezoelectric layers, wherein the length of the relay electrode is aligned generally perpendicular to the length of the individual electrodes, and wherein the common electrodes adjacent in a thickness direction of the first and second piezoelectric layers are electrically connected through the relay electrode by electroconductive members in a plurality of through holes formed in the first piezoelectric layers and along the extending direction of the relay electrode and by electroconductive members in a plurality of through holes formed in the second piezoelectric layers and along the extending direction of the relay electrode.

* * * * *